(12) United States Patent
Tomioka et al.

(10) Patent No.: US 10,184,808 B2
(45) Date of Patent: Jan. 22, 2019

(54) ENCODER AND ROBOT HAVING AN OPTICAL SCALE WITH A POLARIZING PORTION

(71) Applicant: Seiko Epson Corporation, Tokyo (JP)

(72) Inventors: Hiroto Tomioka, Chino (JP); Tetsuo Nishida, Suwa (JP)

(73) Assignee: Seiko Epson Corporation (JP)

( * ) Notice: Subject to any disclaimer, the term of this patent is extended or adjusted under 35 U.S.C. 154(b) by 81 days.

(21) Appl. No.: 15/493,817

(22) Filed: Apr. 21, 2017

(65) Prior Publication Data

US 2017/0307419 A1 Oct. 26, 2017

(30) Foreign Application Priority Data

Apr. 25, 2016 (JP) ................ 2016-087311
Feb. 1, 2017 (JP) ................ 2017-017058

(51) Int. Cl.
| | |
|---|---|
| *G01D 5/347* | (2006.01) |
| *B25J 13/08* | (2006.01) |
| *G01D 5/34* | (2006.01) |
| *H01S 5/026* | (2006.01) |
| *H01S 5/183* | (2006.01) |
| *H01S 5/042* | (2006.01) |
| *H01S 5/343* | (2006.01) |
| *H01S 5/42* | (2006.01) |

(52) U.S. Cl.
CPC .......... *G01D 5/3473* (2013.01); *B25J 13/088* (2013.01); *G01D 5/345* (2013.01); *H01S 5/0264* (2013.01); *H01S 5/18311* (2013.01); *H01S 5/18355* (2013.01); *H01S 5/0425* (2013.01); *H01S 5/34313* (2013.01); *H01S 5/423* (2013.01); *H01S 2301/176* (2013.01)

(58) Field of Classification Search
CPC ... G01D 5/3473; G01D 5/345; H01S 5/18355
USPC ........................... 250/231.13, 225
See application file for complete search history.

(56) References Cited

U.S. PATENT DOCUMENTS 6,097,689 A * 8/2000 Choi .................... G11B 7/1356
369/112.19
2014/0306099 A1 10/2014 Oguchi et al.

FOREIGN PATENT DOCUMENTS

WO WO-2013-065737 A1 5/2013

* cited by examiner

*Primary Examiner* — Que T Le
(74) *Attorney, Agent, or Firm* — Harness, Dickey & Pierce, P.L.C.

(57) ABSTRACT

An encoder includes an optical scale that is so provided as to be pivotable around a pivotal axis and includes a polarizing portion having a polarization characteristic, a light outputting portion that outputs linearly polarized light toward the polarizing portion, and a light detecting portion that detects the linearly polarized light from the optical scale. The light outputting portion includes a vertical cavity surface emitting laser, and light emitted from the vertical cavity surface emitting laser spreads at an angle greater than or equal to 5° but smaller than or equal to 20°.

20 Claims, 12 Drawing Sheets

ENCODER AND ROBOT HAVING AN OPTICAL SCALE WITH A POLARIZING PORTION

BACKGROUND

1. Technical Field

The present invention relates to an encoder and a robot.

2. Related Art

As one kind of encoder, an optical rotary encoder is typically known (see WO 2013/065737, for example). A rotary encoder is used, for example, in a robot including a robot arm having a pivotable joint and detects the rotational angle, the rotational position, the number of revolutions, the rotational speed, and other pivotal states of the joint.

For example, the encoder unit described according to WO 2013/065737 includes an optical scale and an optical sensor package. The optical scale has a polarizer rotatable around the center thereof. The optical sensor package has two optical sensors that are 180° symmetrically positioned with respect to the center of the polarizer and face the polarizer. A polarization layer is provided between each of the optical sensors and the polarizer, and the polarization layer extracts, from light incident on the optical sensor, light polarized in predetermined polarization direction.

In the encoder unit described in WO 2013/065737, in which the polarization layer is provided between each of the optical sensors and the polarizer on the optical scale, the amount of light received with each of the optical sensors decreases, resulting in a problem of a decrease in detection accuracy.

SUMMARY

An advantage of some aspects of the invention is to provide an encoder capable of improving detection accuracy and a robot including the encoder.

The advantage described above can be achieved by the following configurations.

An encoder according to an aspect of the invention includes an optical scale so provided as to be pivotable around a pivotal axis and including a polarizing portion having a polarization characteristic, a light outputting portion that outputs linearly polarized light toward the polarizing portion, and a light detecting portion that detects the linearly polarized light from the optical scale.

According to the thus configured encoder, in which the light outputting portion outputs (radiates) linearly polarized light toward the polarizing portion, the intensity of the light passing through or reflected off the polarizing portion changes when the optical scale pivots. No polarizing element therefore needs to be separately provided between the light outputting portion or the light detecting portion and the optical scale. The amount of light that exits from the light outputting portion and reaches the light detecting portion can therefore increase. As a result, the detection accuracy can be improved.

In the encoder according to the aspect of the invention, it is preferable that the light outputting portion includes a vertical cavity surface emitting laser.

This configuration allows the light outputting portion to output linearly polarized light with the size of the light outputting portion reduced.

In the encoder according to the aspect of the invention, it is preferable that light emitted from the vertical cavity surface emitting laser spreads at an angle greater than or equal to 5° but smaller than or equal to 20°.

A vertical cavity surface emitting laser capable of efficiently emitting linearly polarized light can thus be achieved with the flexibility of the arrangement of the light detecting portion increased.

In the encoder according to the aspect of the invention, it is preferable that the vertical cavity surface emitting laser includes a substrate, a laminate provided on the substrate, and a resin layer provided at least on a side surface of the laminate, and the laminate has a first mirror layer, a second mirror layer provided on a side opposite the substrate with respect to the first mirror layer, and an active layer provided between the first mirror layer and the second mirror layer, in a plan view viewed in a thickness direction of the substrate, a length of the laminate in a first direction is greater than a length of the laminate in a second direction perpendicular to the first direction, and in the plan view, a length of the resin layer in the first direction is greater than a length of the resin layer in the second direction.

This configuration allows a stable single polarization direction of the linearly polarized light emitted from the vertical cavity surface emitting laser. As a result, the life of the vertical cavity surface emitting laser can be prolonged.

In the encoder according to the aspect of the invention, it is preferable that the vertical cavity surface emitting laser overlaps with the optical scale when viewed in a direction along the pivotal axis.

The size of the encoder can therefore be reduced.

In the encoder according to the aspect of the invention, it is preferable that the light detecting portion includes a light receiving device facing the polarizing portion.

This configuration allows the light from the polarizing portion to be efficiently received with the light receiving device.

In the encoder according to the aspect of the invention, it is preferable that the polarizing portion has a plurality of metal strips.

The polarizing portion can therefore reflect light polarized in a specific direction with high efficiency.

In the encoder according to the aspect of the invention, it is preferable that the light outputting portion includes a first light emitting device that emits linearly polarized light toward the polarizing portion and a second light emitting device that emits light linearly polarized in a direction inclining by 45° with respect to a polarization direction of the light from the first light emitting device toward the polarizing portion.

With this configuration, in a case where the first and second light emitting devices are disposed in the same angular position in the circumferential direction around the pivotal axis of the optical scale, the light detecting portion can generate a phase-A signal and a phase-B signal that are out of phase with each other by 45°. The pivotal state of the optical scale can therefore be detected by relatively simple processing or computation using a result of the detection performed by the light detecting portion.

In the encoder according to the aspect of the invention, it is preferable that the light outputting portion includes a third light emitting device that emits light linearly polarized in a direction inclining by 90° with respect to the polarization direction of the light from the first light emitting device toward the polarizing portion and a fourth light emitting device that emits light linearly polarized in a direction inclining by 90° with respect to a polarization direction of the light from the second light emitting device toward the polarizing portion.

With this configuration, in a case where the first to fourth light emitting devices are disposed in the same angular positions in the circumferential direction around the pivotal axis of the optical scale, the light detecting portion can generate a phase-$\overline{A}$ signal, which is out of phase by 90° with respect to the phase-A signal, and a phase-$\overline{B}$ signal, which is out of phase by 90° with respect to the phase-B signal. Deriving an output representing the difference between the phase-A signal and the phase-$\overline{A}$ signal and deriving an output representing the difference between the phase-B signal and the phase-$\overline{B}$ signal allow reduction in the influence of inclination of the polarizing portion, thermal expansion of the polarizing portion due to a change in the temperature, noise resulting from changes in the outputs from the light outputting portion, and other factors.

In the encoder according to the aspect of the invention, it is preferable that the light outputting portion includes a first light emitting device that emits first light that is linearly polarized light toward the polarizing portion and a second light emitting device that emits second light that is linearly polarized light toward the polarizing portion, that the light detecting portion includes a first light receiving device that receives the first light from the polarizing portion and a second light receiving device that receives the second light from the polarizing portion, and that the first light receiving device and the second light receiving device output signals that are out of phase with each other by 45° when the optical scale pivots.

With this configuration, the pivotal state of the optical scale can be detected by relatively simple processing or computation using one of the signals from the first and second light receiving devices as the phase-A signal and the other signal as the phase-B signal.

In the encoder according to the aspect of the invention, it is preferable that the light outputting portion includes a third light emitting device that emits third light that is linearly polarized light toward the polarizing portion and a fourth light emitting device that emits fourth light that is linearly polarized light toward the polarizing portion, that the light detecting portion includes a third light receiving device that receives the third light from the polarizing portion and a fourth light receiving device that receives the fourth light from the polarizing portion, that the first light receiving device and the third light receiving device output signals that are out of phase with each other by 90° when the optical scale pivots, and that the second light receiving device and the fourth light receiving device output signals that are out of phase with each other by 90° when the optical scale pivots.

With this configuration, one of the signals from the third light receiving device and the fourth light receiving device can be used as a phase-$\overline{A}$ signal, which is out of phase by 90° with respect to the phase-A signal, and the other signal can be used as a phase-$\overline{B}$ signal, which is out of phase by 90° with respect to the phase-B signal. Deriving an output representing the difference between the phase-A signal and the phase-$\overline{A}$ signal and deriving an output representing the difference between the phase-B signal and the phase-$\overline{B}$ signal allow reduction in the influence of inclination of the polarizing portion, thermal expansion of the polarizing portion due to a change in the temperature, noise resulting from changes in the outputs from the light outputting portion, and other factors.

In the encoder according to the aspect of the invention, it is preferable that the light outputting portion and the light detecting portion are disposed on the same side of the optical scale.

With this configuration, a reflective encoder can thus be achieved.

A robot according to another aspect of the invention includes the encoder according to the aspect of the invention.

The robot, which includes the encoder having excellent detection accuracy, can perform high-precision action control, for example, by using a result of the detection performed by the encoder.

BRIEF DESCRIPTION OF THE DRAWINGS

The invention will be described with reference to the accompanying drawings, wherein like numbers reference like elements.

DESCRIPTION OF EXEMPLARY EMBODIMENTS

An encoder and a robot according to preferable embodiments of the invention will be described below in detail with reference to the accompanying drawings.

1. Encoder

First Embodiment

Figure 1:
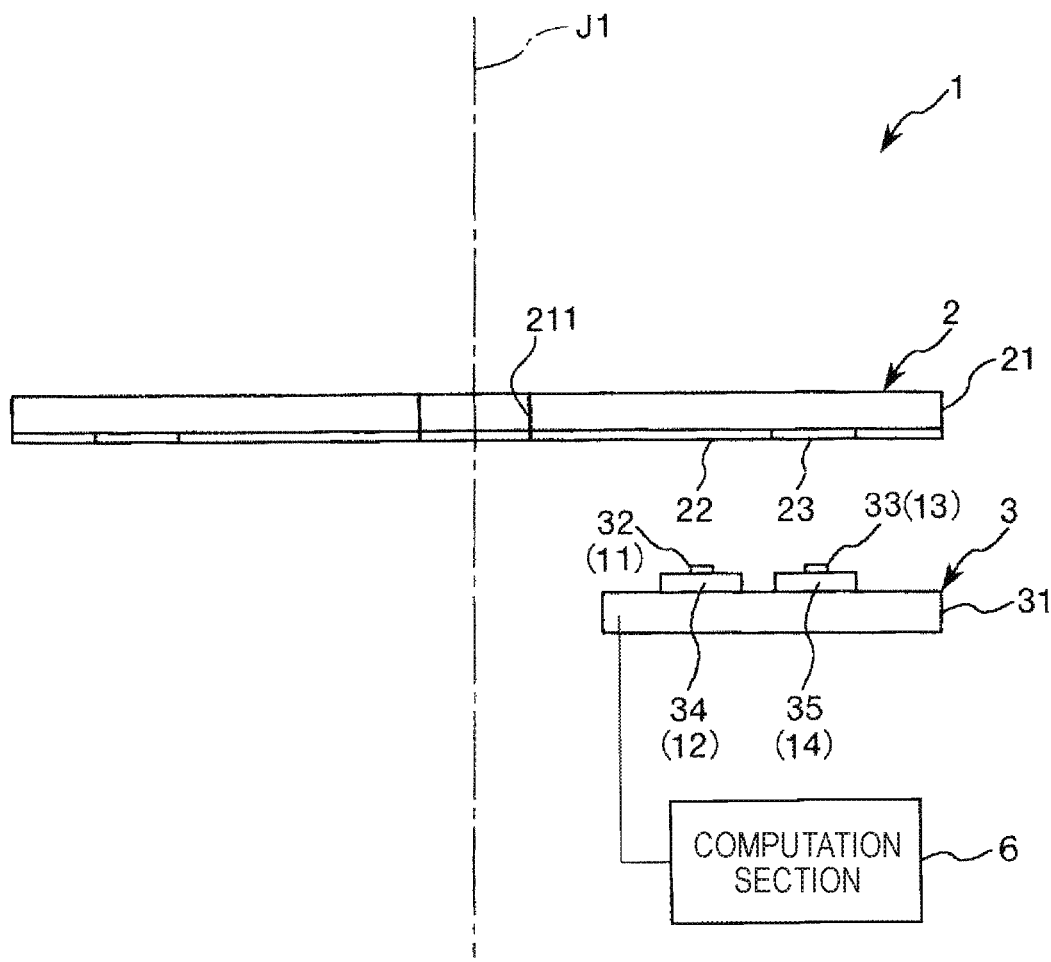
FIG. 1 is a diagrammatic view for describing an encoder according to a first embodiment of the invention.

FIG. 1 is a diagrammatic view for describing an encoder according to a first embodiment of the invention.

An encoder 1 shown in FIG. 1 is a reflective, optical rotary encoder. The encoder 1 includes an optical scale 2, which pivots around a pivotal axis J1, a sensor unit 3, which is so stationarily disposed as to face the optical scale 2, and a computation section 6, which is electrically connected to the sensor unit 3.

The optical scale 2 includes a substrate 21 and further includes a polarizing portion 22 and a 180° determination track 23, which are provided on one surface of the substrate 21. The sensor unit 3 includes a substrate 31 and further includes light emitting devices 32, 33 and light receiving devices 34, 35, which are provided on the substrate 31 and on the side thereof facing the optical scale 2. The light emitting device 32 forms a light outputting portion 11 (first light outputting portion), and the light receiving device 34 forms a light detecting portion 12 (first light detecting portion). The light emitting device 33 forms a light outputting portion 13 (second light outputting portion), and the light receiving device 35 forms a light detecting portion (second light detecting portion).

In the encoder 1, the light emitting device 32 (light outputting portion 11) radiates light onto the polarizing portion 22 of the optical scale 2, and the light emitting device 33 (light outputting portion 13) radiates light onto the 180° determination track 23 on the optical scale 2. The light receiving device 34 (light detecting portion 12) then receives light reflected off the polarizing portion 22, and the light receiving device 35 (light detecting portion 14) receives light reflected off the 180° determination track 23. The computation section 6 determines the pivotal state of the optical scale 2 on the basis of signals (current values) from the light receiving devices 34 and 35.

The signal from the light receiving device 34 is a phase-A signal. The signal from the light receiving device 35 is a 180° pivotal motion determination signal for determining (distinguishing) whether the signal from the light receiving device 34 represents a state in which the optical scale 2 has pivoted by 180°.

Figure 2:
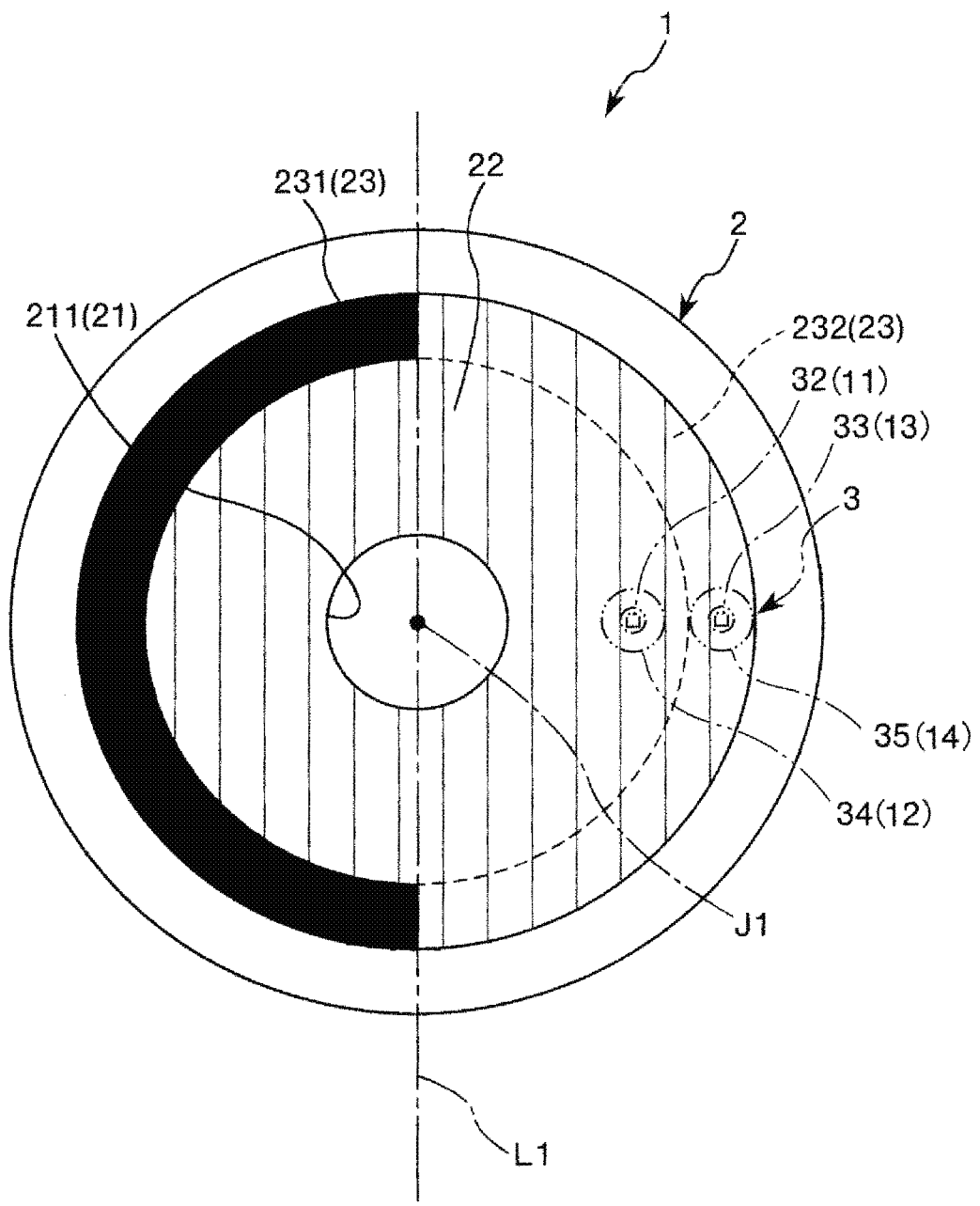
FIG. 2 is a plan view for describing the optical scale provided in the encoder shown in FIG. 1.

The portions that form the encoder 1 will be described below in detail.
Optical Scale FIG. 2 is a plan view for describing the optical scale provided in the encoder shown in FIG. 1. In FIG. 2, the sensor unit 3 is located on the far side of the plane of FIG. 2 with respect to the optical scale 2, seen through the optical scale 2, and drawn with the two-dot chain lines.

The optical scale 2 has a disc-like shape, and a hole 211, which passes through the optical scale 2 in the thickness direction, is provided in a central portion of the optical scale 2. The optical scale 2 is attached to a member (not shown) that pivots around the pivotal axis J1. The optical scale 2 includes the substrate 21 and further includes the polarizing portion 22 and the 180° determination track 23, which are provided on one surface of the substrate 21, as described above.
Substrate The substrate 21 is transparent to the light from the light emitting devices 32 and 33. The substrate 21 is not necessarily made of a specific material and is made, for example, of a glass material or a resin material. In a case where the polarizing portion 22 and the 180° determination track 23 are integrated with each other, the substrate 21 can be omitted.

The polarizing portion 22 and the 180° determination track 23 are disposed side by side on one surface of the thus formed substrate 21 in this order from the center of the substrate 21 toward the periphery thereof.
Polarizing Portion The polarizing portion 22 has a polarization characteristic that causes the polarizing portion 22 to selectively transmit P-polarized light but reflect S-polarized light. The polarizing portion 22 has a polarizing pattern formed of a plurality of wires that are provided along one surface of the substrate 21, are arranged in parallel to one another with a gap therebetween, and reflect, for example, the light from the light emitting device 32.

The polarizing pattern is made of a metal material, for example, aluminum (Al), copper (Cu), chromium (Cr), gold (Au), iron (Fe), platinum (Pt), or an alloy thereof. That is, the polarizing portion 22 has a plurality of linearly extending metal strips (wires made of metal). The thus configured polarizing portion 22 may be formed, for example, by using a known film formation method or by etching or otherwise processing a sheet-shaped or plate-shaped member.

The polarizing portion 22 may instead be separate from the substrate 21 as long as the polarizing portion 22 can pivot when the optical scale 2 pivots around the pivotal axis J1, or a layer (antireflection layer or adjective layer, for example) may be interposed between the polarizing portion 22 and the substrate 21.
180° Determination Track The 180° determination track 23 is formed of two areas 231 and 232 provided along a circle around the pivotal axis J1 and separated by a line L1 passing through the pivotal axis J1 when viewed in the direction along the pivotal axis J1 (hereinafter also referred to as "in a plane view"). That is, the overall 360°-range of the 180° determination track 23 in the circumferential direction is so divided that the area 231 is provided in one 180° range and the area 231 is provided in the remaining 180° range.

The two areas 231 and 232 differ from each other in terms of reflectance. Specifically, one of the two areas 231 and 232 or the area 231 reflects the light from the light emitting device 33, but the other area 232 transmits the light from the light emitting device 33. The reflectance representing the proportion of the light from the light emitting device 33 reflected off the area 231 is therefore higher than the reflectance of the light from the light emitting device 33 reflected off the area 232.

The area 231 is provided with a thin film that reflects the light from the light emitting device 33, but the area 232 is not provided with the thin film. The thin film provided on the area 231 is made, for example, of the same metal material of the polarizing pattern of the polarizing portion 22 described above.

The thin film on the area 231 can be formed, for example, by using a known film formation method and can also be formed simultaneously with the polarizing pattern of the polarizing portion 22 described above. The area 232 may be provided with a thin film having reflectance lower than that of the thin film provided on the area 231 in terms of the light from the light emitting device 33. Further, the polarizing pattern of the polarizing portion 22 is formed also on the area 232 in FIG. 2, but the polarizing pattern on the area 232 may be omitted.

Sensor Unit

Figure 3:
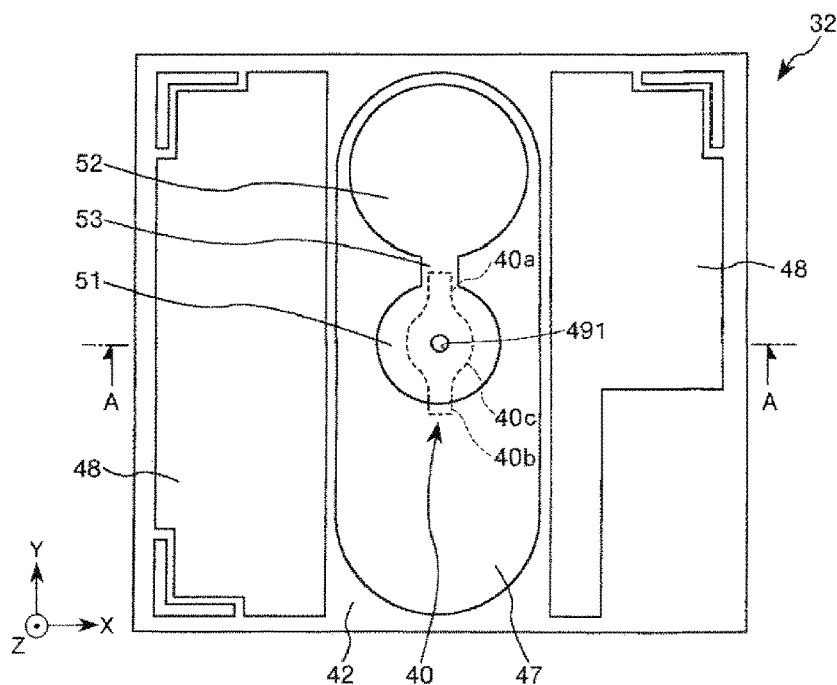
FIG. 3 is a plan view showing an example of the configuration of a light outputting portion provided in the encoder shown in FIG. 1.
Figure 4:
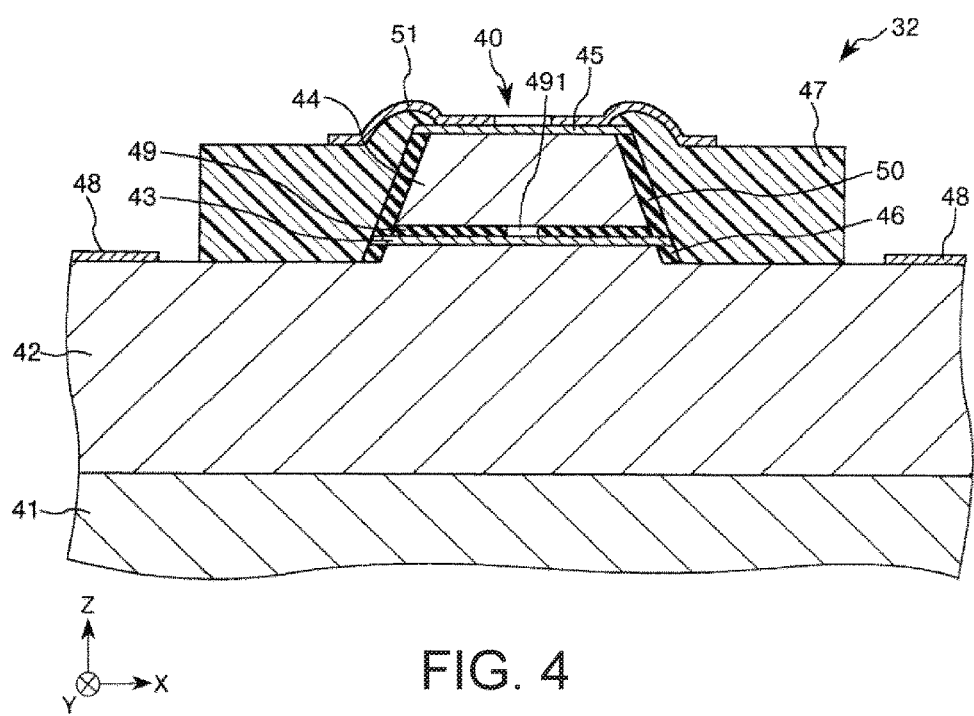
FIG. 4 is a cross-sectional view taken along the line A-A in FIG. 3.
Figure 5:
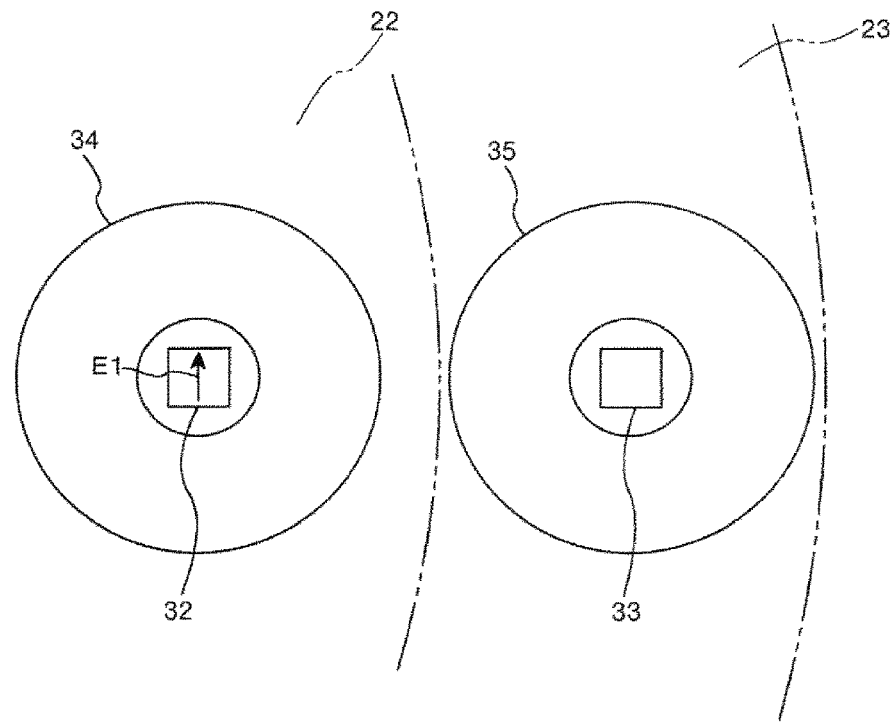
FIG. 5 is a plan view for describing light outputting portions and light detecting portions provided in the encoder shown in FIG. 1.
Figure 6:
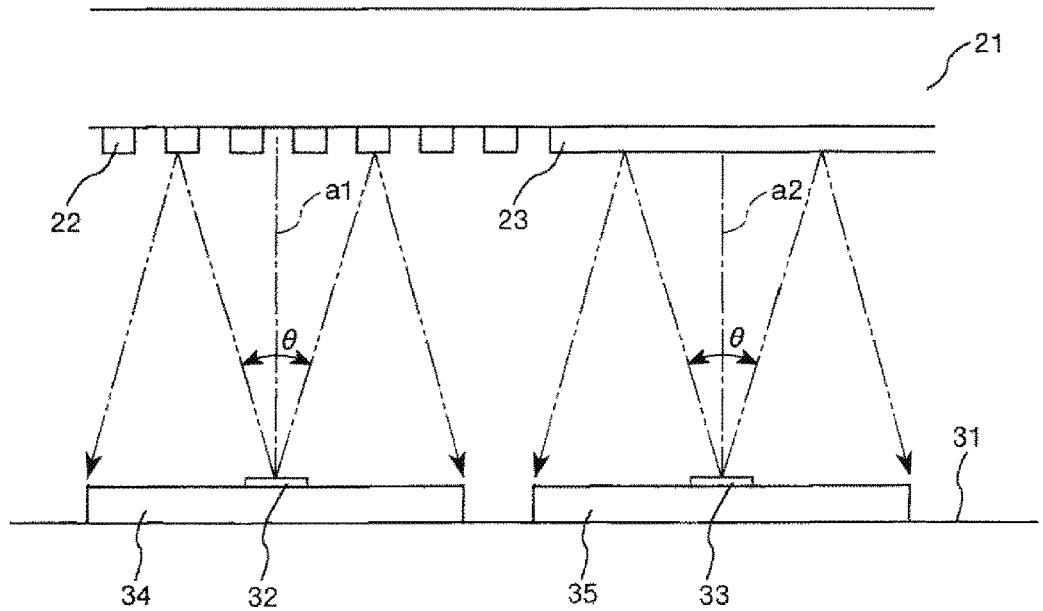
FIG. 6 is a diagrammatic cross-sectional view for describing the light outputting portion and the light detecting portion provided in the encoder shown in FIG. 1.

FIG. 3 is a plan view showing an example of the configuration of each of the light outputting portions provided in the encoder shown in FIG. 1. FIG. 4 is a cross-sectional view taken along the line A-A in FIG. 3. FIG. 5 is a plan view for describing the light outputting portions and the light detecting portions provided in the encoder shown in FIG. 1. FIG. 6 is a diagrammatic cross-sectional view for describing the light outputting portions and the light detecting portions provided in the encoder shown in FIG. 1.

The sensor unit 3 is attached to a member (not shown) that does not pivot around the pivotal axis J1. The sensor unit 3 includes the substrate 31 and further includes the light emitting device 32, 33 and the light receiving device 34, 35 provided on the substrate 31 and on the side thereof facing the optical scale 2, as described above. The light receiving devices 34 and 35 are provided on the substrate 31, the light emitting device 32 is provided on the light receiving device 34, and the light emitting device 33 is provided on the light receiving device 35.

Substrate

The substrate 31 is attached to the member (not shown) that does not pivot around the pivotal axis J1. The substrate 31 is, for example, a wiring substrate, supports the light emitting devices 32, 33 and the light receiving devices 34, 35, and is electrically connected thereto. The substrate 31 is electrically connected to the computation section 6 via a wiring line that is not shown.

Light Emitting Device

The light emitting device 32 is, for example, a vertical cavity surface emitting laser (VCSEL). The light emitting device 32 is preferably configured to stably output linearly polarized light in a desired direction. A preferable example of the light emitting device 32 will be described below. The term "linearly polarized light" is light formed of an electromagnetic wave (light) oscillating in a single plane, in other words, light having an electric field (or magnetic field) oscillating in a fixed direction. The light emitted by the light emitting device 32 (light outputting portion 11) may contain components other than a linearly polarized component, or the polarization direction of the light may change. In this case, however, it is preferable that the amount of the components other than the linearly polarized component and the amount of change in the polarization direction are as small as possible (the amount of other components is 5% of the desired linearly polarized component or smaller and so is the angle of change in the polarization direction).

The light emitting device 32 shown in FIGS. 3 and 4 includes a substrate 41, a first mirror layer 42, an active layer 43, a second mirror layer 44, a current narrowing layer 49, a contact layer 45, a first area 46, a second area 50, a resin layer 47, a first electrode 48, a second electrode 51, a pad 52, and a drawing wiring line 53. The first mirror layer 42, the active layer 43, the second mirror layer 44, the current narrowing layer 49, the contact layer 45, the first area 46, and the second area 50 form a laminate 40. The laminate 40 is surrounded by the resin layer 47.

The substrate 41 is, for example, an n-type (first conductivity type) GaAs substrate.

The first mirror layer 42 is provided on the substrate 41. The first mirror layer 42 is formed, for example, by alternately layering a high-refractive-index layer that is an n-type $Al_{0.12}Ga_{0.88}As$ layer to which silicon is doped and a low-refractive-index layer that is an n-type $Al_{0.9}Ga_{0.1}As$ layer to which silicon is doped.

The active layer 43 is provided on the first mirror layer 42. The active layer 43 has, for example, a multiple quantum well (MQW) structure in which three quantum well structures each formed of an i-type $In_{0.06}Ga_{0.94}As$ layer and an i-type $Al_{0.3}Ga_{0.7}As$ layer are layered on each other.

The second mirror layer 44 is provided on the active layer 43. The second mirror layer 44 is formed, for example, by alternately layering a high-refractive-index layer that is a p-type $Al_{0.12}Ga_{0.88}As$ layer to which carbon is doped and a low-refractive-index layer that is a p-type $Al_{0.9}Ga_{0.1}As$ layer to which carbon is doped.

The second mirror layer 44, the active layer 43, and the first mirror layer 42 form a vertical-resonator-type pin diode. When voltage in the forward direction of the pin diode is applied between the first electrode 48 and the second electrode 51, electrons and holes are recombined with each other in the active layer 43, resulting in light emission. The light emitted from the active layer 43 travels back and forth between the first mirror layer 42 and the second mirror layer 44 (undergoes multiple reflection), resulting in stimulated emission and intensity amplification. Once the optical gain exceeds the optical loss, laser oscillation occurs, whereby a laser beam is outputted via the contact layer 45.

The current narrowing layer 49 is provided between the active layer 43 and the second mirror layer 44. The current narrowing layer 49 may instead be provided in the first mirror layer 42 or the second mirror layer 44. The current narrowing layer 49 is an insulating layer having an opening 491 formed therein. The current narrowing layer 49 has the function of preventing current flowing between the first electrode 48 and the second electrode 51 from spreading in the direction along the active layer 43.

The contact layer 45 is provided on the second mirror layer 44. The contact layer 45 is, for example, a p-type GaAs layer to which carbon is doped.

The first layer 46 is provided on the lateral side of a protrusion of the first mirror layer 42. The first area 46 is formed, for example, by alternately layering an oxide layer produced by oxidizing a layer contiguous to the low-refractive-index layer of the first mirror layer 42 ($Al_{0.9}Ga_{0.1}As$ layer, for example) and a layer contiguous to the high-refractive-index layer of the first mirror layer 42 ($Al_{0.12}Ga_{0.88}As$ layer, for example).

The second area 50 is provided on the lateral side of the second mirror layer 44. The second area 50 is formed, for example, by alternately layering an oxide layer produced by oxidizing a layer contiguous to the low-refractive-index layer of the second mirror layer 44 ($Al_{0.9}Ga_{0.1}As$ layer, for example) and a layer contiguous to the high-refractive-index layer of the second mirror layer 44 ($Al_{0.12}Ga_{0.88}As$ layer, for example).

The laminate 40 formed of the thus configured first mirror layer 42, active layer 43, second mirror layer 44, current narrowing layer 49, contact layer 45, first area 46, and second area 50 has a length in the Y-axis direction longer than the length of the laminate 40 in the X-axis direction in a plan view. In FIG. 3, the laminate 40 has a shape symmetric with respect to both the Y-axis and X-axis directions in a plan view.

The laminate 40 includes a first distortion imparting section 40a, a second distortion imparting section 40b, and a resonator 40c in a plan view, as shown in FIG. 3.

The first distortion imparting section 40a and the second distortion imparting section 40b face each other in the Y-axis direction with the resonator 40c therebetween. The first distortion imparting section 40a and the second distortion imparting section 40b are integrated with the resonator 40c.

The first distortion imparting section 40a and the second distortion imparting section 40b impart distortion to the active layer 43 to polarize the light produced in the active layer 43. The term "polarize light" refers to causing the electric field of light to oscillate in a fixed direction.

The resonator 40c is provided between the first distortion imparting section 40a and the second distortion imparting section 40b. The length of the resonator 40c in the X-axis direction is greater than the length of the first distortion imparting section 40a in the X-axis direction or the length of the second distortion imparting section 40b in the X-axis direction. The resonator 40c has, for example, a circular planar shape. The resonator 40c causes the light produced in the active layer 43 to resonate.

The resin layer 47 is provided at least on the side surface of the laminate 40. The resin layer 47 may completely cover the first distortion imparting section 40a and the second distortion imparting section 40b or may cover part of the first distortion imparting section 40a and the second distortion imparting section 40b. The resin layer 47 is made, for example, of a polyimide.

The first electrode 48 is provided on the first mirror layer 42. The first electrode 48 is in ohmic contact with the first mirror layer 42. The first electrode 48 is electrically connected to the first mirror layer 42. The first electrode 48 is formed, for example, by layering a Cr layer, an AuGe layer, an Ni layer, and an Au layer in this order from the side facing the first mirror layer 42. The first electrode 48 is one of the electrodes for injecting current into the active layer 43. The first electrode 48 may instead be provided on the lower surface of the substrate 41.

The second electrode 51 is provided on the contact layer 45 and the resin layer 47. The second electrode 51 is in ohmic contact with the contact layer 45. The second electrode 51 is electrically connected to the second mirror layer 44 via the contact layer 45. The second electrode 51 is formed, for example, by layering a Cr layer, a Pt layer, a Ti layer, a Pt layer, and an Au layer in this order from the side facing the contact layer 45. The second electrode 51 is the other one of the electrodes for injecting current into the active layer 43.

The second electrode 51 is electrically connected to the pad 52. The second electrode 51 is electrically connected to the pad 52 via the drawing wiring line 53. The pad 52 is provided on the resin layer 47. The pad 52 and the drawing wiring line 53 are made of the same material as that of the second electrode 51.

According to the light emitting device 32 described above, the length of the laminate 40 in the Y-axis direction is greater than the length of the laminate 40 in the X-axis direction in a plan view, and the length of the resin layer 47 in the Y-axis direction is greater than the length of the resin layer 47 in the X-axis direction in the plan view. The first and second distortion imparting sections 40a, 40b and the resin layer 47 can both impart stress to the active layer 43, whereby the polarization direction of the laser beam outputted from the active layer 43 can be stabilized. The polarization direction of the laser beam can therefore be more stabilized, for example, than in a case where only the resin layer 47 (or first and second distortion imparting sections 40a, 40b) imparts stress to the active layer 43.

The light emitting device 32 is not necessarily made of an AlGaAs-based semiconductor material and may be made, for example, of a GaInP-based, ZnSSe-based, InGaN-based, AlGaN-based, InGaAs-based, GaInNAs-based, or GaAsSb-based semiconductor material in accordance with the oscillation wavelength.

The thus configured light emitting device 32 (light outputting portion 11) has the function of outputting light linearly polarized in the direction indicated by the arrow E1 in FIG. 5. The light emitting device 32 radiates light to the polarizing portion 22 of the optical scale 2, as shown in FIG. 6. The light is so emitted from the light emitting device 32 as to spread at a spreading angle θ with respect to the optical axis a1 of the light emitting device 32.

On the other hand, the light emitting device 33 (light outputting portion 13) is, for example, a vertical cavity surface emitting laser or a light emitting diode, and the light emitted from the light emitting device 33 may or may not be polarized. The light emitting device 33 outputs light toward the 180° determination track 23 in such a way that the light spreads with respect to the optical axis a2 of the light emitting device 33.

Light Receiving Device

The light receiving device 34 has an annular light receiving surface, and the light emitting device 32 is disposed inside the light receiving surface in a plan view, as shown in FIG. 5. Similarly, the light receiving device 35 has an annular light receiving surface, and the light emitting device 33 is disposed inside the light receiving surface in a plan view. The light receiving device 34 is disposed on the side closer to the pivotal axis J1 than the light receiving device 35.

Each of the light receiving devices 34 and 35 is, for example, a photodiode. The light receiving device 34 has the function of outputting a detection signal in the form of current according to the intensity of the light reflected off the polarizing portion 22. The light receiving device 35 has the function of outputting a detection signal in the form of current according to the intensity of the light reflected off the 180° determination track 23.

Computation Section

The computation section 6 shown in FIG. 1 is formed, for example, of a CPU (central processing unit) and an SRAM (static random access memory) and has the function of determining the pivotal state of the optical scale 2 by using the signals from the light receiving devices 34 and 35. Examples of the pivotal state may include the pivotal position, the pivotal angle, the pivotal speed, and the pivotal direction.

The configuration of the encoder 1 has been described. The effect of the encoder 1 will be described below.

Figure 7:
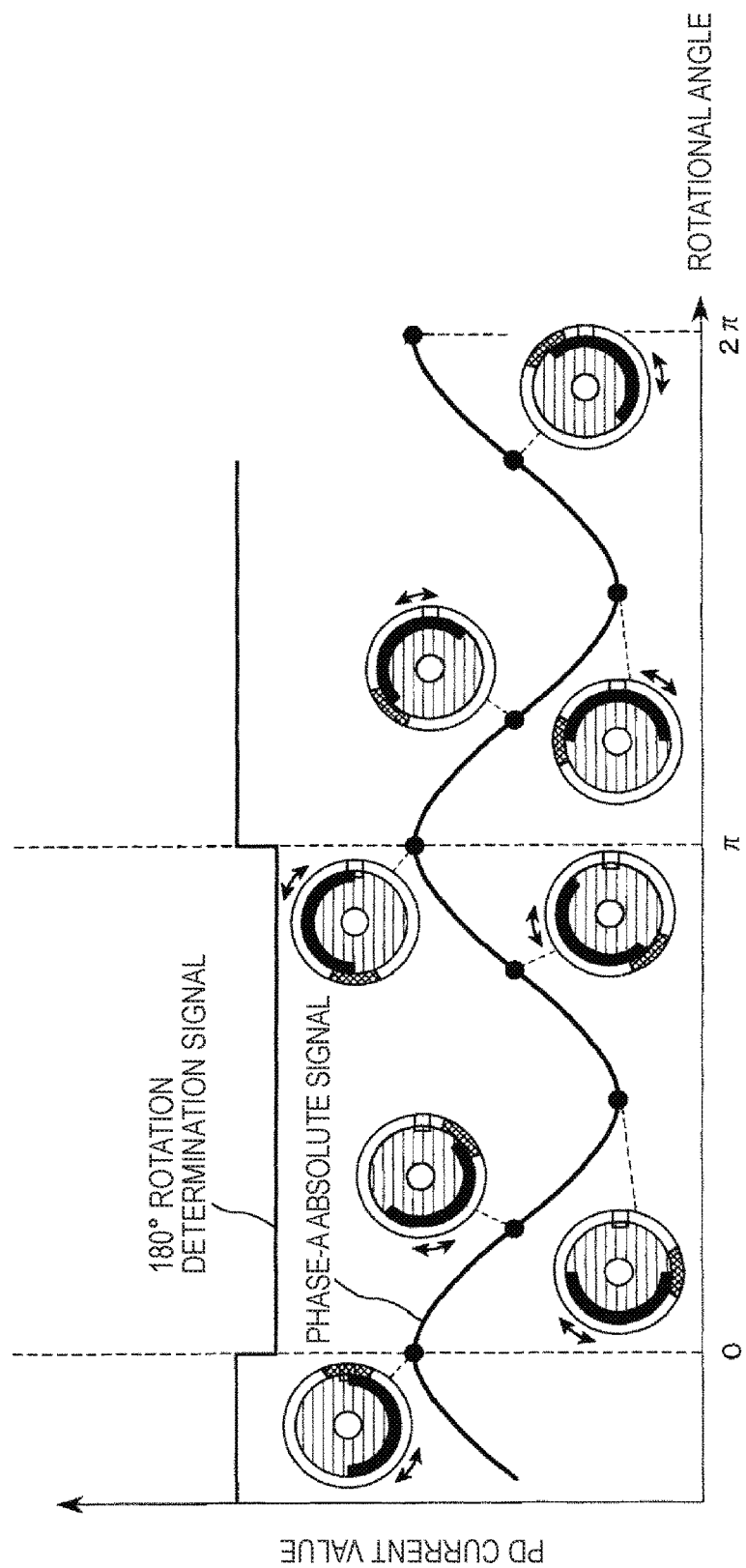
FIG. 7 shows a graph illustrating the relationship between the rotational angle of the optical scale and outputs from the light detecting portions (current values) in the encoder shown in FIG. 1.

FIG. 7 shows a graph illustrating the relationship between the rotational angle of the optical scale and the outputs from the light detecting portions (current values) in the encoder shown in FIG. 1.

The light emitted from the light emitting device 32 is linearly polarized in one direction, as described above. The polarizing portion 22, which is irradiated with the light from the light emitting device 32, has a polarization characteristic that causes the polarizing portion 22 to selectively transmit P-polarized light but reflect S-polarized light.

The light with which the thus configured polarizing portion 22 is irradiated is reflected off the polarizing portion 22 at reflectance that changes in accordance with the pivotal angle of the optical scale 2. The current value (PD current value) of the signal from the light receiving device 34 (phase-A absolute signal) then changes along a sinusoidal wave in accordance with the pivotal angle (rotational angle) of the optical scale 2, as shown in FIG. 7. The pivotal angle of the optical scale 2 ranges from 0 to $2\pi$, and the current value of the signal from the light receiving device 34 draws the same waveform in the range from 0 to $\pi$ and the range from $\pi$ to $2\pi$. Therefore, only the signal from the light receiving device 34 does not allow distinction between the two states of the pivotal angle of the optical scale 2, 0 to $\pi$ and $\pi$ to $2\pi$.

In view of the fact described above, the signal from the light receiving device 35 is used to determine whether the pivotal angle of the optical scale 2 falls within the range from 0 to $\pi$ or the range from $\pi$ to $2\pi$. The 360°-range of the 180° determination track 23 in the circumferential direction is so divided that the area 231 is provided in one 180° range and the area 232 is provided in the remaining 180° range, and the area 231 reflects the light from the light emitting device 33 at higher reflectance than the area 232, as described above.

The light with which the 180° determination track 23, which is formed of the thus configured areas 231 and 232, is irradiated is reflected off the 180° determination track 23 at reflectance that changes in a binary manner in accordance with the pivotal angle of the optical scale 2. The current value (PD current value) of the signal from the light receiving device 35 (180° rotation determining signal) in turn changes in a binary manner in accordance with the pivotal angle (rotational angle) of the optical scale 2, as shown in FIG. 7. The current value of the signal from the light receiving device 35 in the state in which the optical scale 2 is located in the range from 0 to $\pi$ differs from the current value in the state in which the optical scale 2 is located in the range from $\pi$ to $2\pi$. Use of the signal from the light receiving device 35 therefore allows distinction between the state in which the pivotal angle of the optical scale 2 ranges from 0 to $\pi$ and the state in which the pivotal angle of the optical scale 2 ranges from $\pi$ to $2\pi$.

The thus configured encoder 1 includes the optical scale 2, which has the polarizing portion 22 having the polarization characteristic described above, the light outputting portion 11, which outputs linearly polarized light toward the polarizing portion 22, and the light detecting portion 12, which detects the light from the optical scale 2.

According to the thus configured encoder 1, in which the light outputting portion 11 (light emitting device 32) outputs (radiates) linearly polarized light toward the polarizing portion 22, the intensity of the light passing through or reflected off the polarizing portion 22 changes when the optical scale 2 pivots. No polarizing element therefore needs to be separately provided between the light outputting portion 11 or the light detecting portion 12 and the optical scale 2. The amount of light that exits from the light outputting portion 11 and reaches the light detecting portion 12 can therefore increase. As a result, the detection accuracy can be improved.

No polarizing element is provided between the light receiving device 34 provided in the light detecting portion 12 and the polarizing portion 22. The configuration in which the light detecting portion 12 includes the light receiving device 34 facing the polarizing portion 22 allows the light receiving device 34 to efficiently receive the light from the polarizing portion 22.

Further, the configuration in which the light outputting portion 11 includes the light emitting device 32, which is a vertical cavity surface emitting laser, allows the light outputting portion 11 to output linearly polarized light with the size of the light outputting portion 11 reduced.

The light emitted from the light emitting device 32, which is a vertical cavity surface emitting laser, preferably spreads at an angle $\theta$ (whole angle) greater than or equal to 5° but smaller than or equal to 20°, more preferably greater than or equal to 10° but smaller than or equal to 20°. A light emitting device 32 capable of efficiently emitting linearly polarized light can thus be achieved with the flexibility of the arrangement of the light detecting portion 12 increased.

Further, in the case where the "vertical cavity surface emitting laser" shown in FIGS. 3 and 4 described above is used as the light emitting device 32, the light emitting device 32 (vertical cavity surface emitting laser) includes the substrate 41, the laminate 40, which is provided on the substrate 41, and the resin layer 47, which is provided at least on the side surface of the laminate 40. The laminate 40 includes the first mirror layer 42, the second mirror layer 44, which is provided on the side opposite the substrate 41 with respect to the first mirror layer 42, and the active layer 43, which is provided between the first mirror layer 42 and the second mirror layer 44. In particular, in a plan view viewed in the thickness direction of the substrate 41 (Z-axis direction in FIGS. 3 and 4), the length of the laminate 40 in a first direction (Y-axis direction in FIGS. 3 and 4) is greater than the length of the laminate 40 in a second direction (X-axis direction in FIGS. 3 and 4) perpendicular to the first direction. Further, in the plan view, the length of the resin layer 47 in the first direction (Y-axis direction in FIGS. 3 and 4) is greater than the length of the resin layer 47 in the second direction (X-axis direction in FIGS. 3 and 4). Use of the thus configured vertical cavity surface emitting laser as the light emitting device 32 allows a stable single polarization direction of the linearly polarized light emitted from the light emitting device 32. As a result, the life of the light emitting device 32 can be prolonged (the light emitting device 32 can last, for example, at least for 100,000 hours).

Further, the light emitting device 32, which is a "vertical cavity surface emitting laser," overlaps with the optical scale 2 when viewed in the direction along the pivotal axis J1 of the optical scale 2. The size of the encoder 1 can therefore be reduced.

Moreover, since the polarizing portion 22 has a plurality of metal strips, the polarizing portion 22 can reflect light polarized in a specific direction with high efficiency.

In the present embodiment, the light outputting portion 11 and the light detecting portion 12 are disposed on the same side of the optical scale 2. A reflective encoder 1 can therefore be achieved. On the other hand, a transmissive encoder can be achieved by an arrangement in which the light detecting portion 12 is disposed on the side opposite the light outputting portion 11 with respect to the optical scale 2.

Second Embodiment

Figure 8:
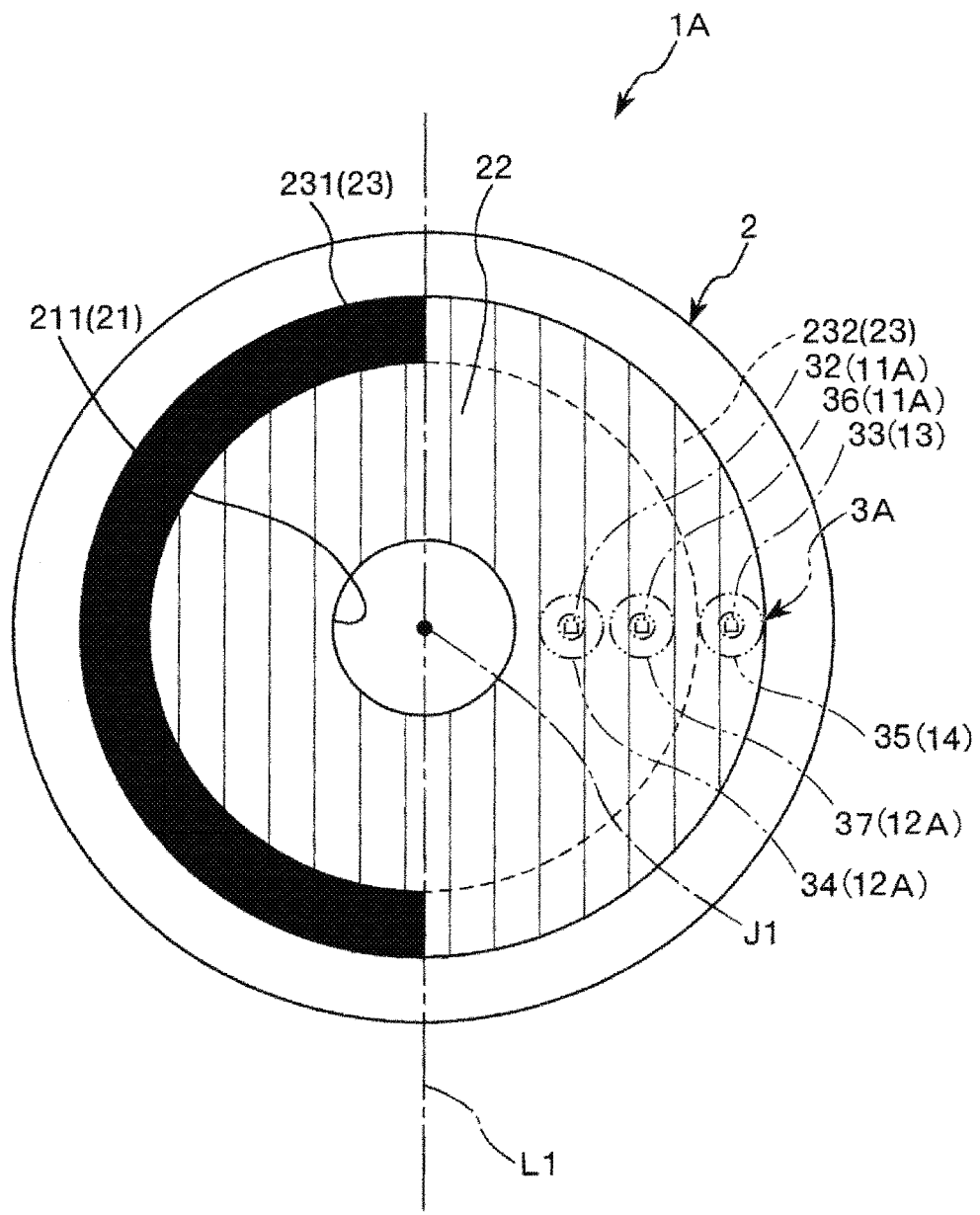
FIG. 8 is a plan view showing an encoder according to a second embodiment of the invention.
Figure 9:
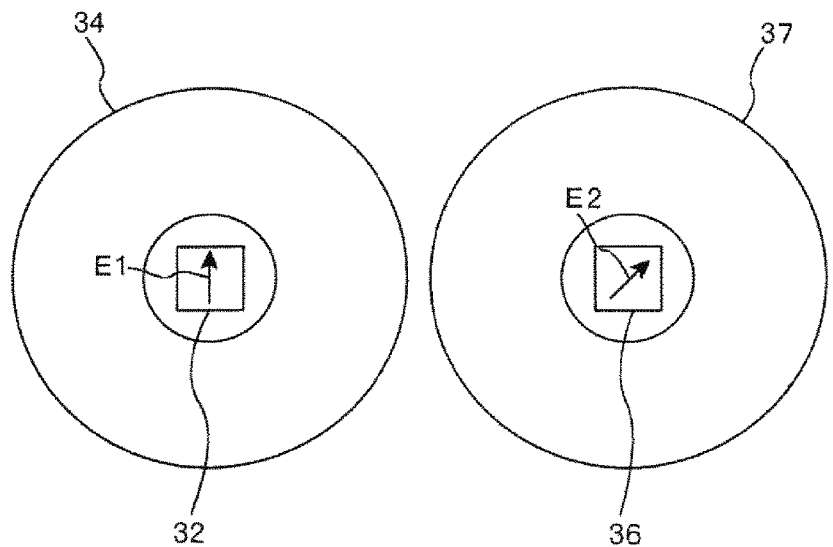
FIG. 9 is a plan view for describing light outputting portions and light detecting portions provided in the encoder shown in FIG. 8.
Figure 10:
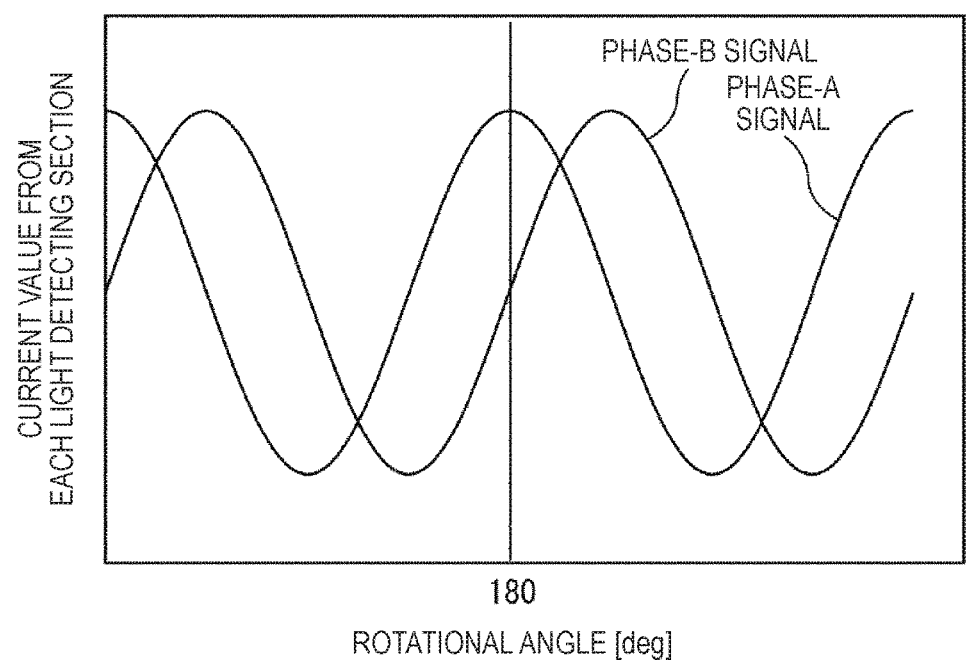
FIG. 10 shows graphs illustrating the relationship between the rotational angle of an optical scale and outputs (current values) from the light detecting portions in the encoder shown in FIG. 8.

FIG. 8 is a plan view showing an encoder according to a second embodiment of the invention. FIG. 9 is a plan view for describing light outputting portions and light detecting portions provided in the encoder shown in FIG. 8. FIG. 10 shows graphs illustrating the relationship between the rotational angle of an optical scale and outputs (current values) from the light detecting portions in the encoder shown in FIG. 8.

In the following description of the second embodiment, differences from the embodiment described above will be primarily described, and the same items will not be described. In FIGS. 8 and 9, the same configurations as those in the embodiment described above have the same reference characters.

The present embodiment is the same as the first embodiment described above except that the light outputting portions and the light detecting portions are differently configured.

A sensor unit 3A provided in an encoder 1A shown in FIG. 8 is disposed on the far side of the plane of FIG. 8 with respect to the optical scale 2 and includes light emitting devices 32, 33, and 36 and light receiving devices 34, 35, and 37. The light emitting devices 32 and 36 form a light outputting portion 11A, and the light receiving devices 34 and 37 form a light detecting portion 12A. The light emitting devices 32, 33, 36 and the light receiving devices 34, 35, 37 are located in the same angular position in the circumferential direction around the pivotal axis J1. Further, the light receiving device 37 is provided on a substrate (not shown) and between the light receiving devices 34 and 37, and the light emitting device 36 is provided above the light receiving device 37.

The light emitting device 36 and the light receiving device 37 have the same configuration as that of the light emitting device 32 and the light receiving device 34, but the light emitting devices 32 and 36 differ from each other in terms of the polarization direction of the light emitted therefrom. Specifically, the light emitting device 36 has the function of emitting light linearly polarized in the direction inclining by 45° with respect to the polarization direction of the light from the light emitting device 32, as indicated by the arrow E2 in FIG. 9. The light emitting device 36 radiates the light to the polarizing portion 22 of the optical scale 2. The light receiving device 37 receives the light reflected off the polarizing portion 22.

As described above, the light outputting portion 11A includes the light emitting device 32, which is a first light emitting device that emits first light that is linearly polarized light toward the polarizing portion 22, and the light emitting device 36, which is a second light emitting device that emits second light that is linearly polarized light toward the polarizing portion 22. The light detecting portion 12A includes the light receiving device 34, which is a first light receiving device that receives the first light from the polarizing portion 22, and the light receiving device 37, which is a second light receiving device that receives the second light from the polarizing portion 22. The light receiving devices 34 and 37 output signals that are out of phase with each other by 45°, as shown in FIG. 10, when the optical scale 2 pivots. As a result, the pivotal state of the optical scale can be detected by relatively simple processing or computation using one of the signals from the light receiving devices 34 and 37 as the phase-A signal and the other signal as the phase-B signal. In the present embodiment, the light receiving device 34 outputs the phase-A signal, and the light receiving device 37 outputs the phase-B signal.

The light outputting portion 11A includes the light emitting device 32, which is the first light emitting device that emits linearly polarized light toward the polarizing portion 22, and the light emitting device 36, which is the second light emitting device that emits light linearly polarized in the direction inclining by 45° with respect to the polarization direction of the light from the light emitting device 32 toward the polarizing portion 22. As a result, in the case where the light emitting devices 32 and 36 are disposed in the same angular position in the circumferential direction around the pivotal axis J1, the light detecting portion 12A can generate a phase-A signal and a phase-B signal that are out of phase with each other by 45°. The pivotal state of the optical scale 2 can therefore be detected by relatively simple processing or computation using a result of the detection performed by the light detecting portion 12A.

According to the second embodiment described above as well, the detection accuracy can be improved.

Third Embodiment

Figure 11:
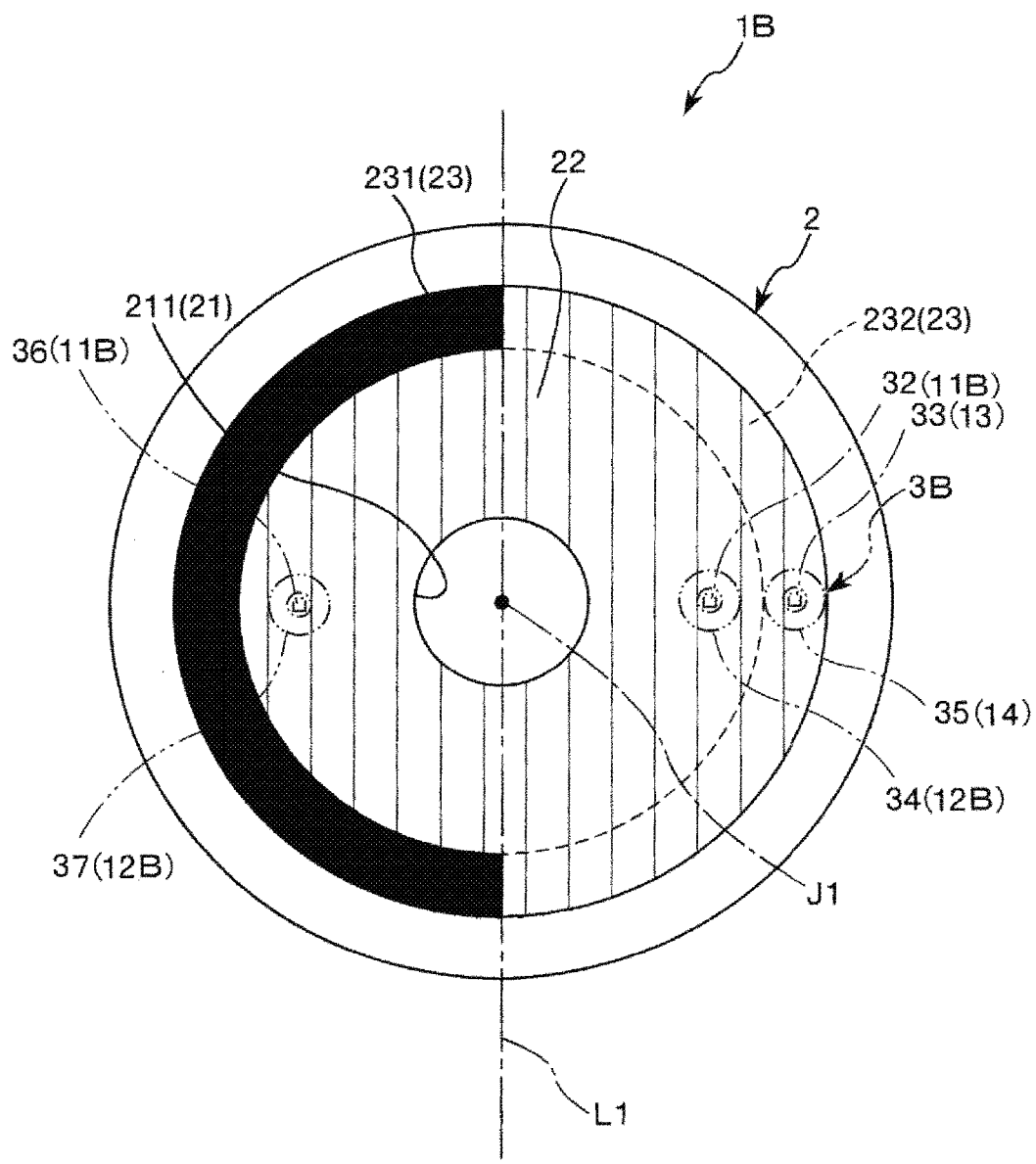
FIG. 11 is a plan view showing an encoder according to a third embodiment of the invention.

FIG. 11 is a plan view showing an encoder according to a third embodiment of the invention.

In the following description of the third embodiment, differences from the embodiments described above will be primarily described, and the same items will not be described. In FIG. 11, the same configurations as those in the embodiments described above have the same reference characters.

The present embodiment is the same as the first embodiment described above except that the light outputting portions and the light detecting portions are differently configured. In particular, the present embodiment is the same as the second embodiment described above except that the second light emitting device and the second light receiving device are arranged differently.

A sensor unit 3B provided in an encoder 1B shown in FIG. 11 is disposed on the far side of the plane of FIG. 11 with respect to the optical scale 2 and includes the light emitting devices 32, 33, and 36 and the light receiving devices 34, 35, and 37. The light emitting devices 32 and 36 form a light outputting portion 11B, and the light receiving devices 34 and 37 form a light detecting portion 12B. The light (linearly polarized light) emitted from the light emitting device 36 has a polarization direction inclining by 45° with respect to the polarization direction of the light from the light emitting device 32 (direction indicated by arrow E2 in FIG. 9 described above), as described in the above second embodiment. The position of the light emitting device 36 and the light receiving device 37 in the circumferential direction around the pivotal axis J1 differs from the positions of the light emitting devices 32, 33 and the light receiving devices 34, 35 by 180°. That is, in the present embodiment, the light emitting device 36 and the light receiving device 37 are disposed on the side opposite the light emitting devices 32, 33 and the light receiving devices 34, 35 with respect to the pivotal axis J1. The arrangement described above also allows the phase-A signal and the phase-B signal to be obtained, as in the second embodiment described above.

According to the third embodiment described above as well, the detection accuracy can be improved.

Fourth Embodiment

Figure 12:
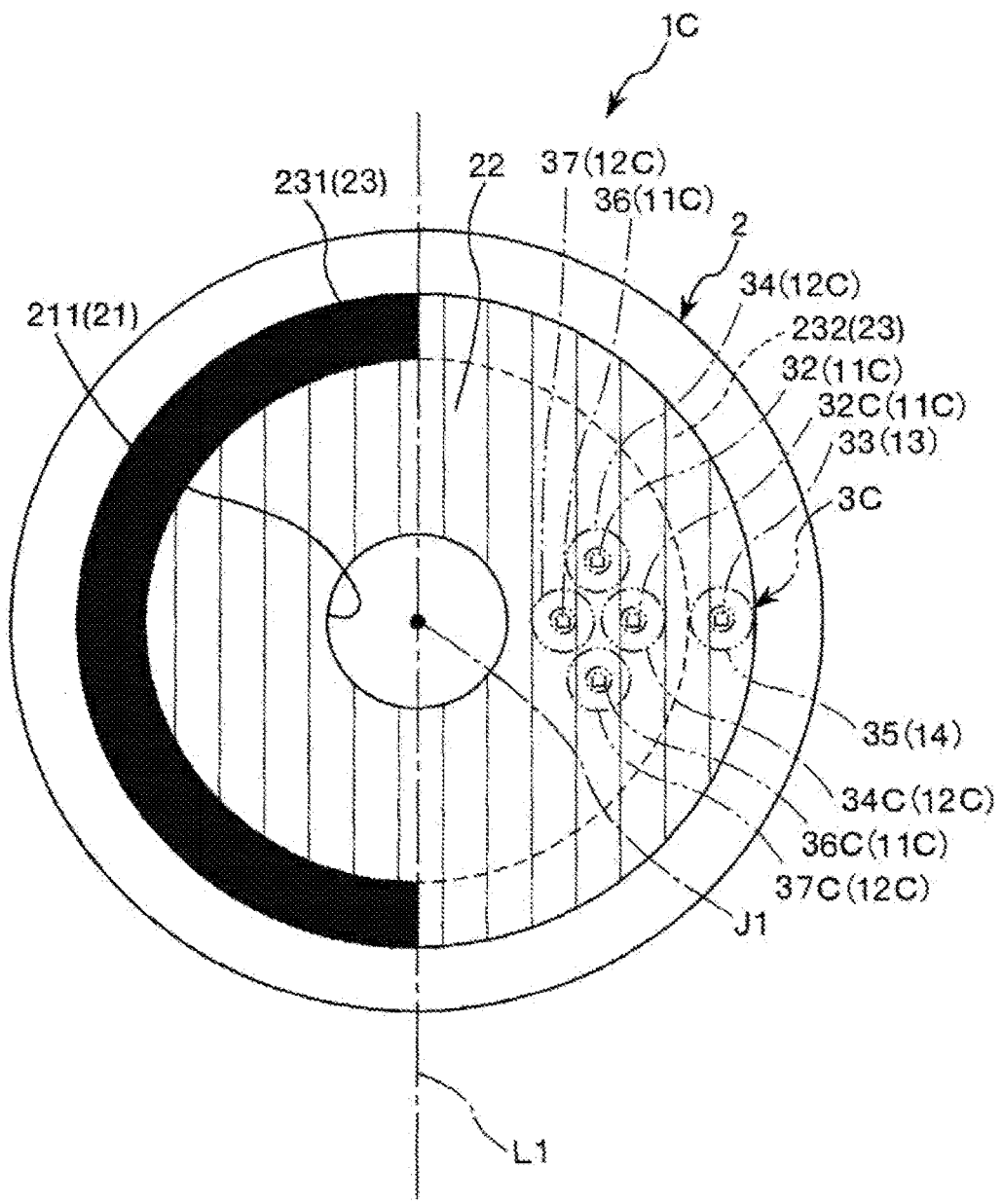
FIG. 12 is a plan view showing an encoder according to a fourth embodiment of the invention.
Figure 13:
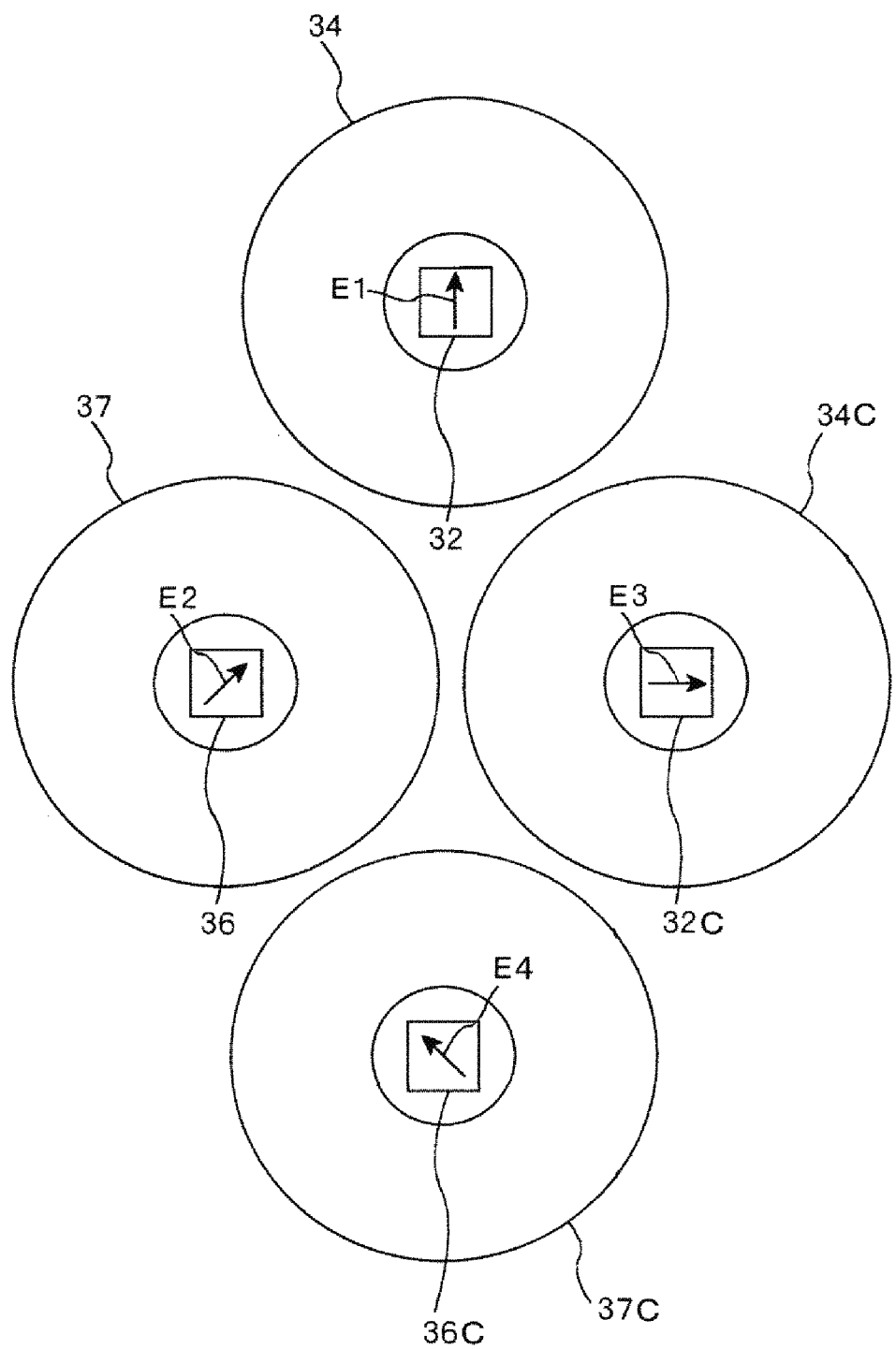
FIG. 13 is a plan view for describing light outputting portions and light detecting portions provided in the encoder shown in FIG. 12.
Figure 14:
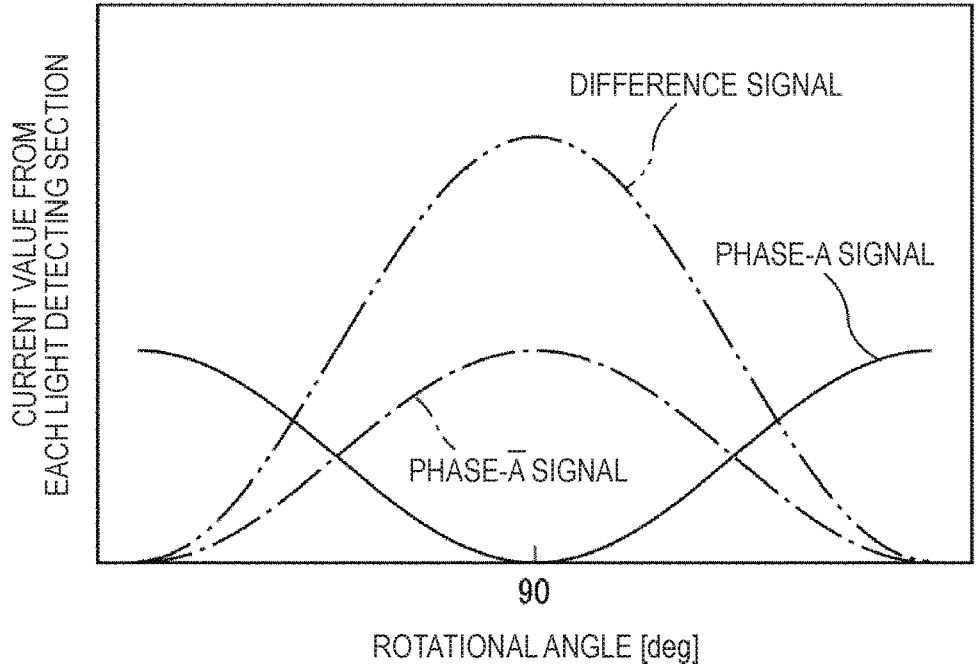
FIG. 14 shows graphs illustrating the relationship between the rotational angle of an optical scale and outputs (current values) from the light detecting portions in the encoder shown in FIG. 12.
Figure 15:
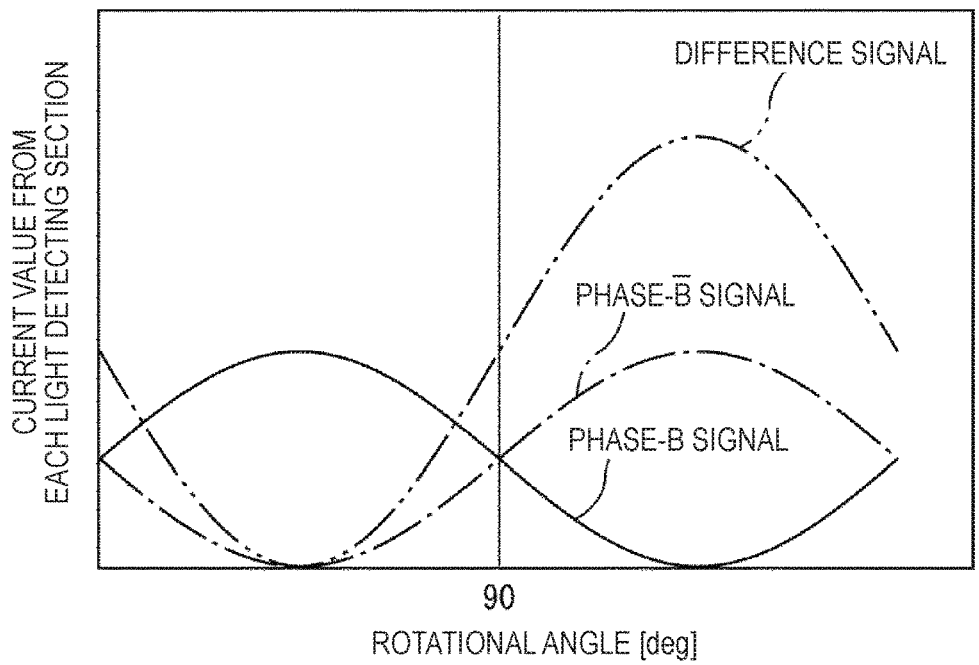
FIG. 15 shows a graph illustrating the relationship between the rotational angle of the optical scale and outputs (current values) from the light detecting portions in the encoder shown in FIG. 12.

FIG. 12 is a plan view showing an encoder according to a fourth embodiment of the invention. FIG. 13 is a plan view for describing light outputting portions and light detecting portions provided in the encoder shown in FIG. 12. FIG. 14 shows a graph illustrating the relationship between the rotational angle of an optical scale and outputs (current values) from the light detecting portions in the encoder shown in FIG. 12. FIG. 15 shows a graph illustrating the relationship between the rotational angle of the optical scale and outputs (current values) from the light detecting portions in the encoder shown in FIG. 12.

In the following description of the fourth embodiment, differences from the embodiments described above will be primarily described, and the same items will not be described. In FIGS. 12 and 13, the same configurations as those in the embodiments described above have the same reference characters.

The present embodiment is the same as the first embodiment described above except that the light outputting portions and the light detecting portions are differently configured.

A sensor unit 3C provided in an encoder 1C shown in FIG. 12 is disposed on the far side of the plane of FIG. 12 with respect to the optical scale 2 and includes light emitting devices 32, 32C, 33, 36, and 36C and light receiving devices 34, 34C, 35, 37, and 37C. The light emitting devices 32, 32C, 36 and 36C form a light outputting portion 11C, and the light receiving devices 34, 34C, 37, and 37C form a light detecting portion 12C. The light emitting devices 32, 32C, 33, 36, and 36C and the light receiving devices 34, 34C, 35, 37, and 37C are located in roughly the same angular positions in the circumferential direction around the pivotal axis J1.

In FIG. 12, the light receiving devices 34C and 37 are disposed side by side along the radial direction of the optical scale 2, and the light receiving devices 34 and 37C are so disposed side by side along the circumferential direction of the optical scale 2 as to sandwich the light receiving devices 34C and 37.

The light emitting devices 32, 32C, 36, and 36C differ from one another in terms of the polarization direction of the light emitted therefrom. Specifically, the light emitting device 32C has the function of emitting light linearly polarized in the direction inclining by 90° with respect to the polarization direction of the light from the light emitting device 32, as indicated by the arrow E3 in FIG. 13. The light emitting device 36C has the function of emitting light linearly polarized in the direction inclining by 90° with respect to the polarization direction of the light from the light emitting device 36, as indicated by the arrow E4 in FIG. 13.

The light emitting devices 32C and 36C radiate the light to the polarizing portion 22 of the optical scale 2. The light receiving devices 34C and 37C receive the light reflected off the polarizing portion 22.

As described above, the light outputting portion 11C includes the light emitting device 32C, which is a third light emitting device that emits third light that is linearly polarized light toward the polarizing portion 22, and the light emitting device 36C, which is a fourth light emitting device that emits fourth light that is linearly polarized light toward the polarizing portion 22, in addition to the light emitting devices 32 and 36, which are the first and second light emitting devices. The light detecting portion 12C includes the light receiving device 34C, which is a third light receiving device that receives the third light from the polarizing portion 22, and the light receiving device 37C, which is a fourth light receiving device that receives the fourth light from the polarizing portion 22, in addition to the light receiving devices 34 and 37, which are the first and second light receiving devices. The light receiving devices 34 and 34C output signals that are out of phase with each other by 90° when the optical scale 2 pivots, as shown in FIG. 14. The light receiving devices 37 and 37C output signals that are out of phase with each other by 90° when the optical scale 2 pivots, as shown in FIG. 15.

As a result, the signal from the light receiving device 34C can be used as a phase-$\overline{A}$ signal that is out of phase by 90° with respect to the phase-A signal, and the signal from the light receiving device 37C can be used as a phase-$\overline{B}$ signal that is out of phase by 90° with respect to the phase-B signal.

Deriving an output representing the difference between the phase-A signal and the phase-$\overline{A}$ signal (difference signal), as shown in FIG. 14, and deriving an output representing the difference between the phase-B signal and the phase-$\overline{B}$ signal (difference signal), as shown in FIG. 15, allow reduction in the influence of inclination of the polarizing portion 22, thermal expansion of the polarizing portion 22 due to a change in the temperature, noise resulting from changes in the outputs from the light outputting portion 11C, and other factors.

The light outputting portion 11C includes the light emitting device 32C, which is the third light emitting device that emits light linearly polarized in the direction inclining by 90° with respect to the polarization direction of the light from the light emitting device 32, which is the first light emitting device, toward the polarizing portion 22, and the light emitting device 36C, which is the fourth light emitting device that emits light linearly polarized in the direction inclining by 90° with respect to the polarization direction of the light from the light emitting device 36, which is the second light emitting device, toward the polarizing portion 22.

As a result, in the case where the light emitting devices 32, 32C, 36, and 36C are disposed in roughly the same positions in the circumferential direction around the pivotal axis J1 of the optical scale 2, the light detecting portion 12C can generate the phase-$\overline{A}$ signal, which is out of phase by 90° with respect to the phase-A signal, and the phase-$\overline{B}$ signal, which is out of phase by 90° with respect to the phase-B signal. Deriving an output representing the difference between the phase-A signal and the phase-$\overline{A}$ signal and deriving an output representing the difference between the phase-B signal and the phase-$\overline{B}$ signal allow reduction in the influence of inclination of the polarizing portion 22, thermal expansion of the polarizing portion 22 due to a change in the temperature, noise resulting from changes in the outputs from the light outputting portion 11C, and other factors.

According to the fourth embodiment described above as well, the detection accuracy can be improved.

2. Robot

Figure 16:
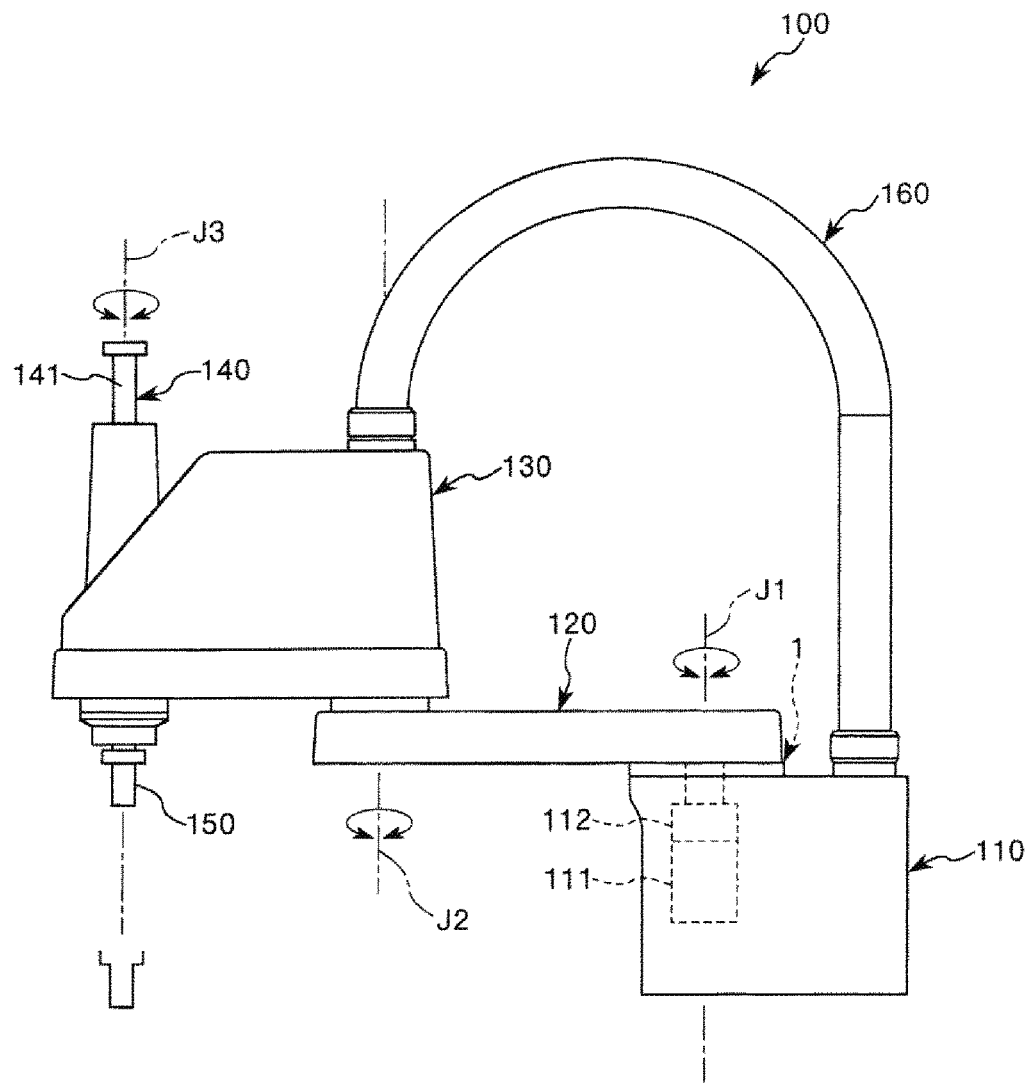
FIG. 16 is a side view showing an example of a robot according to an embodiment of the invention.

FIG. 16 is a side view showing an example of a robot according to an embodiment of the invention. In the following description, the upward side in FIG. 16 is called "upward," and the downward side in FIG. 16 is called "downward" for ease of description. Further, the side facing a base in FIG. 16 is called a "base end," and the side opposite the base end (end effector side) is called a "front end." The upward/downward direction in FIG. 16 is called a "vertical direction," and the rightward/leftward direction in FIG. 16 is called a "horizontal direction."

A robot 100 shown in FIG. 16 is what is called a horizontal multi-articulated robot (SCARA robot), is used, for example, in a manufacturing step of manufacturing a precision instrument or any other instrument, and can, for example, grasp, transport, and otherwise manipulate a precision instrument, a part, or any other object.

The robot 100 includes a base 110, a first art 120, a second arm 130, a work head 140, an end effector 150, and a wiring router 160, as shown in FIG. 16. Each of the portions of the robot 100 will be sequentially and briefly described below.

The base 110 is fixed, for example, to a floor surface that is not shown with bolts or any other fasteners. The first arm 120 is joined with an upper end portion of the base 110. The first arm 120 is pivotable relative to the base 110 around the pivotal axis J1, which is a first axis along the vertical direction.

A first motor 111, which produces drive force that causes the first arm 120 to pivot, and a first speed reducer 112, which reduces the drive force produced by the motor 111, are disposed in the base 110. The input shaft of the first speed reducer 112 is joined with the rotating shaft of the first motor 111, and the output shaft of the first speed reducer 112 is joined with the first arm 120. Therefore, when the first motor 111 is driven and the drive force therefrom is transmitted to the first arm 120 via the first speed reducer 112, the first arm 120 pivots in a horizontal plane around the pivotal axis J1 relative to the base 110.

The base 110 and the first arm 120 are provided with the encoder 1, which is a first encoder that detects the pivotal state of the first arm 120 relative to the base 110. Specifically, for example, the optical scale 2 described above is attached to the output shaft of the first speed reducer 112 or the first arm 120, and the sensor unit 3 is attached to the base 110 or a member fixed thereto.

The second arm 130 is joined with a front end portion of the first arm 120. The second arm 130 is pivotable relative to the first arm 120 around a second axis J2 along the vertical direction, and a second motor that produces drive force that causes the second arm 130 to pivot and a second speed reducer that reduces the drive force produced by the second motor are disposed, although not shown, in the second arm 130. When the drive force from the second motor is transmitted to the second arm 130 via the second speed reducer, the second arm 130 pivots in a horizontal plane around the second axis J2 relative to the first arm 120. Although not shown, the second motor is provided with a second encoder that detects the pivotal state of the second arm 130 relative to the first arm 120.

The work head 140 is disposed at a front end portion of the second arm 130. The work head 140 has a spline shaft 141, which is inserted through a spline nut and a ball screw nut (neither of them is shown) disposed coaxially with each other in the front end portion of the second arm 130. The spline shaft 141 is rotatable around the axis thereof relative to the second arm 130 and movable (ascendable and descendable) in the upward/downward direction.

Although not shown, a rotary motor and an ascent/descent motor are disposed in the second arm 130. The drive force from the rotary motor is transmitted to the spline nut via a drive force transmission mechanism that is not shown, and when the spline nut rotates in the forward direction or the reverse direction, the spline shaft 141 rotates in the forward direction or the reverse direction around an axis J3 along the vertical direction. Although not shown, the rotary motor is provided with a third encoder that detects the pivotal state of the spline shaft 141 relative to the second arm 130.

On the other hand, the drive force from the ascent/descent motor is transmitted to the ball screw nut via a drive force transmission mechanism that is not shown, and when the ball screw nut rotates in the forward direction or the reverse direction, the spline shaft 141 moves upward or downward. The ascent/descent motor is provided with a fourth encoder that detects the travel of the spline shaft 141 with respect to the second arm 130.

The end effector 150 is joined with a front end portion (lower end portion) of the spline shaft 141. The end effector 150 is not limited to a specific one and may, for example, be a gripper that grips an object to be transported or a processor that processes an object to be processed.

A plurality of wiring lines connected to the electronic parts (second motor, rotary motor, ascent/descent motor, second to fourth encoders, for example) disposed in the second arm 130 are routed through the wiring router 160, which has a tubular shape and joins the second arm 130 with the base 110, into the base 110. Further, the plurality of wiring lines are bundled together in the base 110 and routed, along with wiring lines connected to the first motor 111 and the encoder 1, to a controller that is not shown but is disposed in a position outside the base 110 and integrally controls the robot 100.

The robot 100 described above, which includes the encoder 1 having excellent detection accuracy, can perform high-precision action control, for example, by using a result of the detection performed by the encoder 1.

The encoder and robot according to the preferable embodiments of the invention have been described with reference to the drawings. The invention is, however, not limited to the embodiments, and the configuration of each portion can be replaced with an arbitrary configuration having the same function. Further, other arbitrary components may be added to the embodiments described above.

The location where the encoder is disposed is not limited to the joint between the base and the first arm and may be the joint between arbitrary two arms that pivot relative to each other. Further, the location where the encoder is disposed is not limited to a joint provided in a robot.

In the embodiments described above, the number of robot arms is one, but not necessarily, and the number of robot arms may, for example, be two or more. That is, the robot according to the embodiment of the invention may, for example, be a multi-arm robot, such as a double-arm robot.

In the embodiments described above, the number of arms of the robot arm is two, but not necessarily, and the number of arms may, for example, be one or three or more.

In the embodiments described above, the location where the robot according to the embodiment of the invention is installed is not limited to a floor surface and may instead, for example, be a ceiling surface or a sidewall surface. Further, the robot according to the embodiment of the invention is not limited to a robot fixed to and installed in a building or any other structural object and may, for example, be a leg walking (traveling) robot having legs.

In the embodiments described above, a horizontal multi-articulated robot has been described as an example of the robot according to the embodiment of the invention, but the robot according to the embodiment of the invention may be a robot of a different type, such as a vertical multi-articulated robot, as long as the robot has two members that pivot relative to each other.

The optical scale and the encoder according to any of the embodiments of the invention can be used in an industrial printer and a consumer printer that have a rotating portion.

The above embodiments have been described with reference to the case where the light outputting portions and the light detecting portions are arranged side by side along the radial direction of the optical scale, but not necessarily, and the light outputting portions and the light detecting portions may be so disposed as to be shifted from each other in the circumferential direction of the optical scale.

In the embodiments described above, the 180° determination track 23 provided on the optical scale is used to distinguish the pivotal states of the optical scale that differ from each other by 180°. The distinction may instead be performed, for example, by using an output from a different component, for example, another encoder so provided as to be coaxial with the optical scale. Further, in a case where the distinction between the pivotal states of the optical scale that differ from each other by 180° is not required, the configuration for the distinction (the 180° determination track, the second light outputting portion, and the second light detecting portion in the embodiments described above) can be omitted.

The entire disclosure of Japanese Patent Application No. 2016-087311, filed Apr. 25, 2016 and No. 2017-017058, filed Feb. 1, 2017 are expressly incorporated by reference herein.

What is claimed is:

1. An encoder comprising:
an optical scale so provided as to be pivotable around a pivotal axis and including a polarizing portion having a polarization characteristic;
a light outputting portion that outputs linearly polarized light toward the polarizing portion; and
a light detecting portion that detects the linearly polarized light from the optical scale.

2. The encoder according to claim 1, wherein the light outputting portion includes a vertical cavity surface emitting laser.

3. The encoder according to claim 2, wherein light emitted from the vertical cavity surface emitting laser spreads at an angle greater than or equal to 5° but smaller than or equal to 20°.

4. The encoder according to claim 2,
wherein the vertical cavity surface emitting laser includes a substrate,
a laminate provided on the substrate, and
a resin layer provided at least on a side surface of the laminate,
the laminate has a first mirror layer, a second mirror layer provided on a side opposite the substrate with respect to the first mirror layer, and an active layer provided between the first mirror layer and the second mirror layer,
in a plan view viewed in a thickness direction of the substrate, a length of the laminate in a first direction is greater than a length of the laminate in a second direction perpendicular to the first direction, and
in the plan view, a length of the resin layer in the first direction is greater than a length of the resin layer in the second direction.

5. The encoder according to claim 2, wherein the vertical cavity surface emitting laser overlaps with the optical scale when viewed in a direction along the pivotal axis.

6. The encoder according to claim 1, wherein the light detecting portion includes a light receiving device facing the polarizing portion.

7. The encoder according to claim 1, wherein the polarizing portion has a plurality of metal strips.

8. The encoder according to claim 1, wherein the light outputting portion includes a first light emitting device that emits linearly polarized light toward the polarizing portion and a second light emitting device that emits light linearly polarized in a direction inclining by 45° with respect to a polarization direction of the light from the first light emitting device toward the polarizing portion.

9. The encoder according to claim 8, wherein the light outputting portion includes a third light emitting device that emits light linearly polarized in a direction inclining by 90° with respect to the polarization direction of the light from the first light emitting device toward the polarizing portion and a fourth light emitting device that emits light linearly polarized in a direction inclining by 90° with respect to a polarization direction of the light from the second light emitting device toward the polarizing portion.

10. The encoder according to claim 1,
wherein the light outputting portion includes a first light emitting device that emits first light that is linearly polarized light toward the polarizing portion and a second light emitting device that emits second light that is linearly polarized light toward the polarizing portion,
the light detecting portion includes a first light receiving device that receives the first light from the polarizing portion and a second light receiving device that receives the second light from the polarizing portion, and
the first light receiving device and the second light receiving device output signals that are out of phase with each other by 45° when the optical scale pivots.

11. The encoder according to claim 10,
wherein the light outputting portion includes a third light emitting device that emits third light that is linearly polarized light toward the polarizing portion and a fourth light emitting device that emits fourth light that is linearly polarized light toward the polarizing portion,
the light detecting portion includes a third light receiving device that receives the third light from the polarizing portion and a fourth light receiving device that receives the fourth light from the polarizing portion,
the first light receiving device and the third light receiving device output signals that are out of phase with each other by 90° when the optical scale pivots, and
the second light receiving device and the fourth light receiving device output signals that are out of phase with each other by 90° when the optical scale pivots.

12. The encoder according to claim 1, wherein the light outputting portion and the light detecting portion are disposed on the same side of the optical scale.

13. A robot comprising the encoder according to claim 1.
14. A robot comprising the encoder according to claim 2.
15. A robot comprising the encoder according to claim 3.
16. A robot comprising the encoder according to claim 4.
17. A robot comprising the encoder according to claim 5.
18. A robot comprising the encoder according to claim 6.
19. A robot comprising the encoder according to claim 7.
20. A robot comprising the encoder according to claim 8.

* * * * *